United States Patent
Van De Mast et al.

(10) Patent No.: US 8,903,156 B2
(45) Date of Patent: Dec. 2, 2014

(54) METHOD OF UPDATING CALIBRATION DATA AND A DEVICE MANUFACTURING METHOD

(75) Inventors: Franciscus Van De Mast, Eindhoven (NL); Engelbertus Antonius Fransiscus Van Der Pasch, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 429 days.

(21) Appl. No.: 13/328,519

(22) Filed: Dec. 16, 2011

(65) Prior Publication Data

US 2012/0156807 A1 Jun. 21, 2012

Related U.S. Application Data

(60) Provisional application No. 61/425,081, filed on Dec. 20, 2010.

(51) Int. Cl.
*G06K 9/00* (2006.01)
*H01L 21/68* (2006.01)
*H01L 21/67* (2006.01)
*G03F 7/20* (2006.01)

(52) U.S. Cl.
CPC ............ *G03F 7/70775* (2013.01); *H01L 21/68* (2013.01); *H01L 21/67259* (2013.01); *G03F 7/70516* (2013.01)
USPC ........................................................ 382/144

(58) Field of Classification Search
None
See application file for complete search history.

(56) References Cited

U.S. PATENT DOCUMENTS

| | | | |
|---|---|---|---|
| 6,639,686 B1 | 10/2003 | Ohara | |
| 7,292,312 B2 | 11/2007 | Loopstra et al. | |
| 7,502,096 B2 | 3/2009 | Tempelaars et al. | |
| 7,839,485 B2 * | 11/2010 | Shibazaki | 355/53 |
| 8,488,106 B2 * | 7/2013 | Shibazaki et al. | 355/72 |
| 2004/0207824 A1 | 10/2004 | Lof et al. | |
| 2006/0023178 A1 | 2/2006 | Loopstra et al. | |
| 2007/0181827 A1 | 8/2007 | Tempelaars et al. | |
| 2007/0288121 A1 | 12/2007 | Shibazaki | |
| 2008/0094592 A1 | 4/2008 | Shibazaki | |

(Continued)

FOREIGN PATENT DOCUMENTS

| | | |
|---|---|---|
| CN | 1728002 | 2/2006 |
| CN | 101071279 | 11/2007 |

(Continued)

OTHER PUBLICATIONS

Computer english translation of Japanese patent (JP 2010-074075), pp. 1-32.*

(Continued)

*Primary Examiner* — Daniel Mariam
(74) *Attorney, Agent, or Firm* — Pillsbury Winthrop Shaw Pittman LLP (57) ABSTRACT

A method of updating calibration data of a first position detection system adapted to determine the position of an object, is presented. The first position detection system includes a target and a plurality of sensors one of which is mounted on an object and the calibration data including coefficients relating an apparent measured position to an actual position and which can be used to convert an apparent measured position to an actual position thereby to correct for physical imperfections in the first position detection system and enable determination of the actual position from the apparent measured position.

20 Claims, 8 Drawing Sheets

(56) References Cited

U.S. PATENT DOCUMENTS

| | | | |
|---|---|---|---|
| 2008/0109178 A1 | 5/2008 | Sogard et al. | |
| 2009/0033900 A1 | 2/2009 | Kanaya | |
| 2011/0053061 A1 | 3/2011 | Shibazaki | |
| 2011/0177461 A1 | 7/2011 | Shibazaki et al. | |

FOREIGN PATENT DOCUMENTS

| | | |
|---|---|---|
| CN | 101356623 | 1/2009 |
| CN | 101405840 | 4/2009 |
| EP | 1 420 298 | 5/2004 |
| JP | 5-134753 | 6/1993 |
| JP | 2010-507804 | 3/2010 |
| JP | 2010-074075 | 4/2010 |
| JP | 2010-510672 | 4/2010 |
| WO | 99/49504 | 9/1999 |
| WO | 2007/083758 | 7/2007 |
| WO | 2008/051232 | 5/2008 |

OTHER PUBLICATIONS

Japanese Office Action mailed Dec. 3, 2012 in corresponding Japanese Patent Application No. 2011-272650.

* cited by examiner

METHOD OF UPDATING CALIBRATION DATA AND A DEVICE MANUFACTURING METHOD

CROSS REFERENCE TO RELATED APPLICATIONS

This application claims priority and benefit under 35 U.S.C. §119(e) to U.S. Provisional Patent Application No. 61/425,081, entitled "Method of Updating Calibration Data and a Device Manufacturing Method," filed on Dec. 20, 2010. The content of that application is incorporated herein in its entirety by reference.

FIELD

The present invention relates to a method of updating calibration data of a first position detection system adapted to determine the position of an object and to a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Conventionally, in a lithographic apparatus, the position of a table, for example a substrate table, is measured using a laser interferometer. In this system, gratings are placed on the edge of the table and laser beams shined at the gratings. The reflection is measured by a sensor positioned next to the laser light source. A difficulty with such measurement systems is that they can suffer from changes in refractive index of the medium (e.g. air) through which the beam travels. Additionally, their accuracy is not that great, though their long term stability is high.

Recently a new type of position measurement unit, called an encoder, has been developed. An encoder is described, for example, in U.S. Pat. No. 6,639,686 (hereby incorporated in its entirety by reference). A 2D grating target is positioned on the table or above the area at which the table is being used for processes which require accurate positional measurement of the table. Encoders comprising an emitter and a receiver are positioned at the other of the table and above the table. This has the benefit that the distance any radiation beams need to travel is reduced (so that any change in refractive of the medium through which the radiation beam passes has a smaller effect) as well as it being easier, should it be necessary, to condition the environment through which the radiation beams pass.

Both types of positional measurement system are disclosed as being used in parallel in, for example, US 2007/0288121 and US 2008/0094592 (both hereby incorporated in their entirety by reference). Using both systems allows accurate measurement using the encoder while the table is positioned under the projection system, for example, while still allowing positional measurement of the table over its entire movement range (which includes an area which is not under the projection system).

The above combination of table positioning devices can be used in any lithographic apparatus. The system may be particularly desirably used in immersion or EUV lithographic apparatus.

In immersion lithography, it has been proposed to immerse the substrate in the lithographic projection apparatus in a liquid having a relatively high refractive index, e.g. water, so as to fill a space between the final element of the projection system and the substrate. In an implementation, the liquid is distilled water, although another liquid can be used. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

In an immersion apparatus, immersion fluid is handled by a fluid handling system, device structure or apparatus. In an implementation the fluid handling system may supply immersion fluid and therefore be a fluid supply system. In an embodiment the fluid handling system may at least partly confine immersion fluid and thereby be a fluid confinement system. In an implementation the fluid handling system may provide a barrier to immersion fluid and thereby be a barrier member, such as a fluid confinement structure. In an implementation the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an implementation, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

The long term stability of an encoder type position measurement device may not be that great. Therefore, it may be desirable to perform a calibration process frequently in order to make use of the better accuracy allowed by an encoder system over an interferometer system.

It is desirable, for example, to provide a calibration method which does not result in a large amount of downtime of the apparatus.

According to an aspect, there is provided a method of updating calibration data of a first position detection system adapted to determine the position of an object, the first position detection system comprising a target and a plurality of sensors one of which is mounted on an object and the calibration data comprising coefficients relating an apparent measured position to an actual position and which can be used to convert an apparent measured position to an actual position thereby to correct for physical imperfections in the first position detection system and enable determination of the actual position from the apparent measured position, the method comprising: using a second position detection system which is independent of the first position detection system to determine the position of the object; calculating a difference between the position detected by the second position detection system and a position determined by the first position detection system; and using the calculated difference to update the coefficient of the respective apparent measured position, on the assumption that the position detected by the second position detection system is the actual position, wherein measurements made to determine the positions used to calculate the difference are made during periods of normal use of the object.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
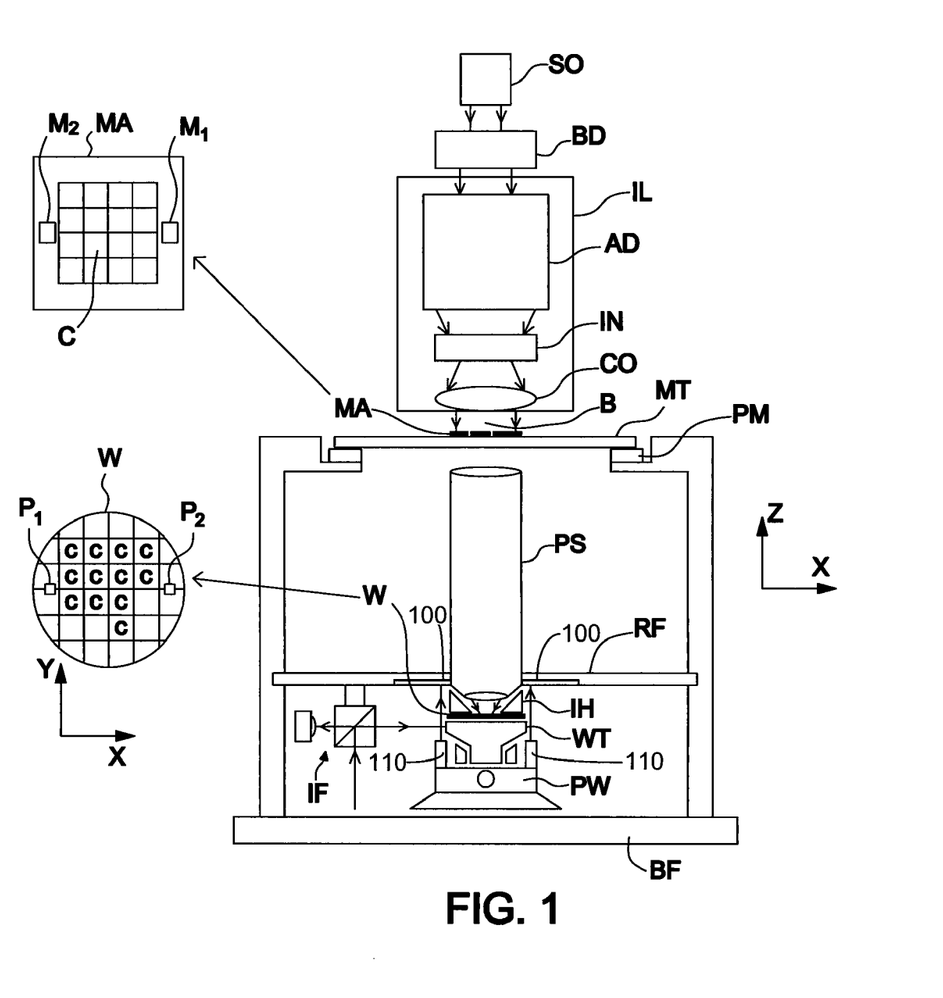
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, to direct, shape, or control radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, sensor and measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-7 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
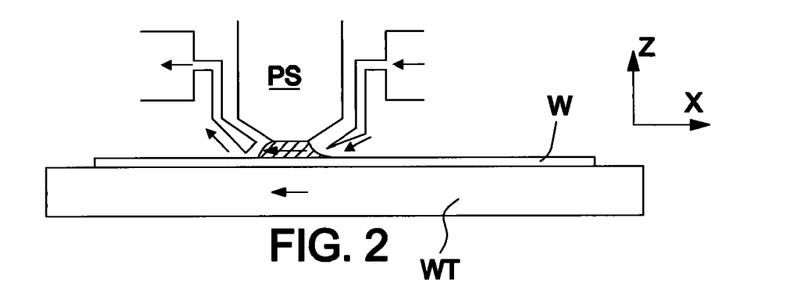
FIGS. 2 and 3 depict a liquid supply system for use in a lithographic projection apparatus.
Figure 3:
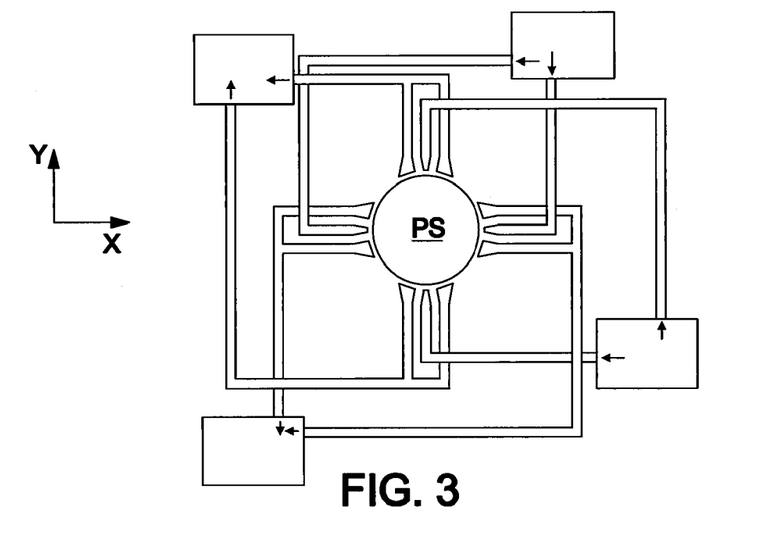

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
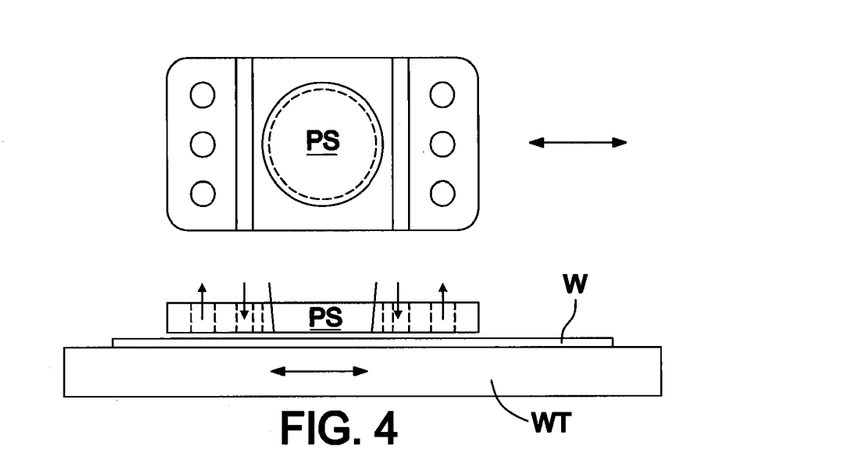
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

Figure 5:
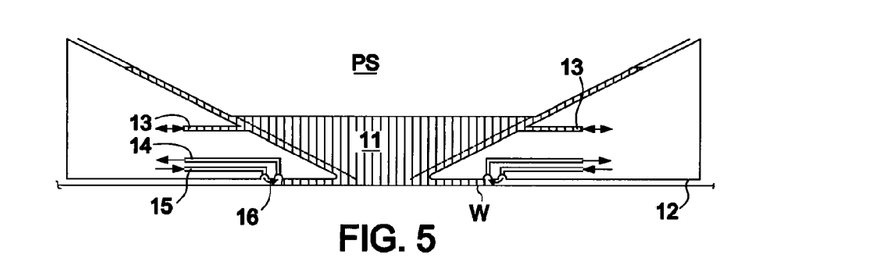
FIG. 5 depicts a further liquid supply system for use in a lithographic projection apparatus.

FIG. 5 schematically depicts a localized liquid supply system or fluid handling system with a liquid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The liquid confinement structure 12 is substantially stationary relative to the projection system in the XY plane though there may be some relative movement in the Z direction (in the direction of the optical axis). In an embodiment, a seal is formed between the liquid confinement structure 12 and the surface of the substrate W and may be a contactless seal such as a gas seal (such a system with a gas seal is disclosed in European patent application publication no. EP-A-1,420,298) or liquid seal.

The liquid confinement structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the liquid confinement structure 12 positioned below and surrounding the final element of the projection system PS. Liquid is brought into the space below the projection system PS and within the liquid confinement structure 12 by liquid inlet 13. The liquid may be removed by liquid outlet 13. The liquid confinement structure 12 may extend a little above the final element of the projection system. The liquid level rises above the final element so that a buffer of liquid is provided. In an embodiment, the liquid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the barrier member 12 and the surface of the substrate W. The gas seal is formed by gas. The gas in the gas seal is provided under pressure via inlet 15 to the gap between barrier member 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the barrier member 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the liquid confinement structure 12 does not have a gas seal.

As illustrated in FIG. 1, a table of the lithographic apparatus, for example a substrate table WT is provided with first and second position detection systems. The first position detection system is an encoder type system for example as described in US 2007/0288121.

Figure 6:
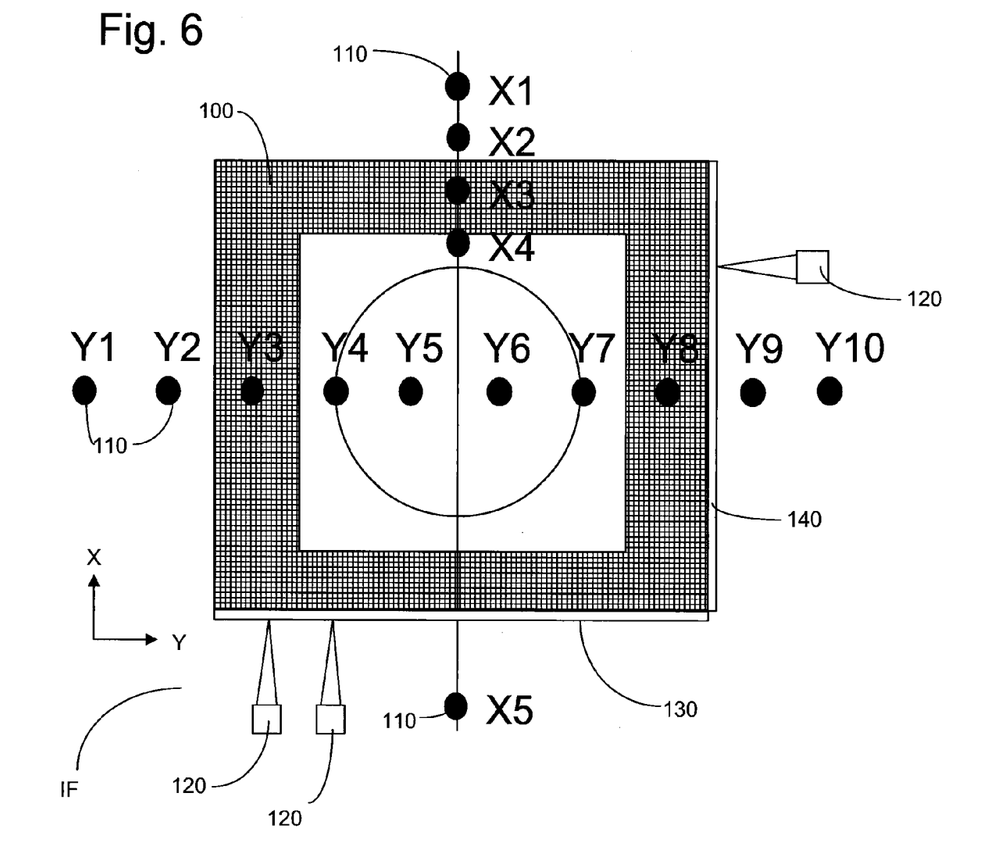
FIG. 6 illustrates, in plan, a substrate table and first and second position detection systems.

The first position detection system comprises a target 100 and a plurality of encoders 110 comprising an emitter/receiver combination (Y1-Y10 and X1-X5). One of the target 100 and encoders 110 is mounted to the substrate table WT. As illustrated in FIG. 1, the plurality of encoders 110 are mounted on the substrate table WT and the target 100 is mounted in fixed position relative to the projection system. In an alternative embodiment, as illustrated in FIG. 6, the target 100 is mounted to the substrate table WT and the plurality of encoders 110 are mounted above the substrate table WT in fixed position relative to the projection system PS.

The target 100 comprises a two dimensional grid. The position detection system is constructed and arranged such that at least three encoders 110 can transmit a beam of radiation onto the target 100 and receive a reflected and/or a refracted beam of radiation at any one time.

A second position detection system IF comprises an interferometer which includes three emitter/receiver combinations 120 and at least two grids 130, 140 mounted substantially orthogonally on the edge of the substrate table WT.

A beam of radiation from an emitter/receiver combination 120 is directed to a grid 130, 140 and reflected back. One or two emitter/receiver combinations 120 are provided for each axis.

The positions determined may be the X, Y and Rz degrees of freedom. In an embodiment the positions determined additionally include the Rx and Ry degrees of freedom.

The first position detection system is particularly accurate and can be used for fine position measurement in proximity to the fixed component of the first position detection system. For example, the fixed component of the target 100 and plurality of encoders 110 can be in fixed position surrounding the axis of the projection system PS.

However, because of the limited size, in plan, of the substrate table WT, this system either requires a large footprint for the fixed component (which is usually not available) or can only be used for positioning in a local area.

As extremely accurate positioning is only desired in certain areas of a lithographic apparatus, for example around the axis of the projection system PS, the first position detection system is ideally suited for determining a position of a substrate table WT relative to the projection system PS. However, the range of travel of a substrate table WT needs to be greater than the area covered by the first position detection system. For this reason the second position detection system is also included in the apparatus. This allows a much greater range of movement of the substrate table WT whilst it is still having its position measured.

A difficulty with the second position detection system is that changes in refractive index of the medium through which the radiation beams pass (e.g. a change in temperature, pressure or composition of the gas through which the radiation beam passes) can lead to errors in the detected position. This is particularly problematic because of the long distances through which the radiation beams need to travel. In contrast, the distances which the radiation beams of the first position detection system need to travel are much smaller. However, the first position detection system may be less stable when compared to the second position detection system. This is because of the use of a two dimensional target 100 which is particularly prone to deformations during use (for example thermal expansion and thermal contraction deformations) which can lead to errors in positional readings.

For this reason it is necessary frequently to calibrate the first position detection system to ensure that accurate positional information of the substrate table WT is measured by the first position detection system.

Physical imperfections in the measurement system lead to errors in the raw, uncorrected measurement result. For this reason calibration data is generated. This calibration data can be used to determine an actual position of the substrate table WT from an apparent measured position (e.g. raw uncorrected measured data) detected by the first position detection system. The calibration data is used to correct for physical imperfections in the first position detection system.

The calibration data comprises coefficients which relate an apparent measured position to an actual position. Thus, the coefficients can be used to transform an apparent measured position into an actual position thereby to correct for physical imperfections in the first position detection system.

Examples of imperfections in the first position detection system are imperfections in the two dimensional grid of the target 100 (e.g. grid lines not evenly spaced apart or not straight), non orthogonal mounting of the target 100 relative to the encoders 110 of the apparatus (or substrate table WT if mounted on the substrate table WT) and the fact that the encoders 110 may not be lined up in a line or positioned orthogonally to one another. The calibration data can take account of these and other physical imperfections to allow determination of the actual position of the substrate table WT from the apparent measured position.

The stability of the second position detection system IF is greater than that of the first position detection system. However, the second position detection system can also suffer from physical imperfections such as the grids 130, 140 not being orthogonal. However, relatively simple calibration techniques are known which can be used to calibrate the second position calibrate systems. In this way the second position detection system can generate reliable and stable positional measurements, given constant refractive index of the medium through which the measurement beams pass.

An embodiment of the present invention uses the fact that the second position detection system IF is stable to calibrate the first position detection system. This is possible because the first and second position detection systems are independent of one another.

After calibration data has been initially generated, the first and second position detection systems take measurements of the position of the substrate table WT at the same time. A difference between the determined positions (the position determined by the second position detection system and either the apparent measured position or calculated actual position determined by the first position detection system) is calculated to generate a difference between the position detected by the second position detection system IF and an apparent measured position or an actual position determined by the first position detection system. On the assumption that the position detected by the second position detection system is the actual position, the calculated difference is used to update the coefficient of the respective apparent measured position. The calculated difference can be calculated using a processor. The processor can be part of a controller of the first and/or second position detection system. In one embodiment, the processor can be part of a controller of the lithographic apparatus.

The measurements made to determine the positions used to calculate the difference are made during periods of normal use of the object. That is, for example, the measurements are made during movement of the substrate table WT with a substrate W mounted on it under the projection system PS during a scheme for irradiating the substrate W with radiation through the projection system PS. That is, the measurements can be made, for example, during stepping motions, during scanning motions or during motions of the substrate table WT for swapping substrates W under the projection system PS. That is, the method of updating calibration data occurs in-line rather than off-line and the movements of the substrate table WT are movements of the substrate table WT carried out during normal operation and are not extra movements specifically for the purpose of updating the calibration data.

The measurements made by the first and second position detection systems may be made simultaneously. For example, both position detection systems measure the position of the substrate table WT during stepping, scanning and/or swapping. This is beneficial as the calibration of the first detection system can be updated continuously, resulting in a more accurate calibration.

If there is no calculated difference, then no updating of the coefficient of the respective apparent measured position needs to be taken. If the calculated difference does have a magnitude, then this is indicative of the calibration data being inaccurate due, for example, to a change in the physical imperfections of the first position detection system. Therefore, the calculated difference can be used to update the coefficient of the respective apparent measured position.

Because the position determined by the second position detection system IF may be subject to errors introduced by changes in refractive index of the atmosphere through which the beams of radiation pass, there may be errors in the position detected by the second position detection system IF. However, any such errors introduced are likely to be random rather than systematic in nature. Therefore, over time the average position measured by the second position detection system IF for a given position of substrate table WT should vary around the actual position. Therefore only a fraction of that required change is applied to the coefficient each time when updating the coefficient. Using this system, over time, systematic changes in the physical imperfections of the first position detection system will be corrected but random errors in the second position detection system IF will average out to subtract one another.

In an embodiment the calculated difference is passed through a low pass filter before being used to update the coefficient, only systematic errors in the coefficient of the respective apparent measured position will be taken into account rather than random differences due to changes in refractive index. With a low pass filter, a low-frequency fraction of the signal is used.

In the low pass filter, the calculated difference can be used to calculate a required change in the coefficient required to convert the apparent measured position of the first position detection system into the position detected by the second position detection system.

Alternatively the calculated difference may be used as the required change.

In one embodiment the updating only occurs after the required change for a given measured position has been calculated to be in a predetermined range (e.g. within a predetermined percentage) for more than a predetermined number of times for a given apparent measured position.

Therefore, using this low pass filter only those errors which are consistently detected will be corrected for.

In an embodiment the updating includes updating coefficients for measured positions adjacent the respective apparent measured position. That is, the coefficients for measured positions which are next to the apparent measured position for which the calibration coefficient is updated based on the calculated difference, also have their values changed such that the coefficients for measured positions change smoothly between adjacent measured positions. This is beneficial because otherwise the calculated actual position of the first position detection system can jump rather than vary smoothly as the substrate table WT moves under the projection system PS.

In an embodiment the calculated difference is only used to update coefficients when the calculated difference is calculated for positions based on measurements made by the encoders 110 and emitter/receiver combinations 120 of the first and second position detection systems respectively during periods of zero acceleration of the substrate table WT. During acceleration of the substrate table WT deformations may be introduced in the components mounted to the substrate table WT and this can lead to further physical imperfections than are present in steady state. Therefore, by only using measurements made during zero acceleration for updating of the calibration data, the introduction of further errors due to dynamic movement can be avoided.

In an embodiment the calibration data includes an indicator of the last time the difference for each apparent measured position was calculated. In this way it is possible to keep abreast of how update the calibration data for certain positions of substrate table WT are. For instance, it may be that during use the substrate table WT is usually in a range of predetermined positions and that the substrate table WT is in other positions only infrequently. The indicator of the last time the difference for each apparent measured position was calculated can be used to determine how up-to-date the calibration data for any particular given position is. Therefore, a judgment can be made as to how accurate a measured position is based on the indicator. Furthermore, if desired, it is possible to move the substrate table WT to an apparent measured position for which the calibration data indicates the difference as not having been calculated for at least a predetermined period of time and to calculate the difference and update the respective coefficient as necessary. In this way it is possible to ensure that the calibration data for all measured positions which are used is valid.

In an embodiment the calibration data includes a time delay coefficient. The time delay coefficient is indicative of the difference in time it takes for the first position detection system to measure a position and output an apparent measured position and/or actual position and the time taken by the second position detection system between measuring of a position and outputting the position. The time delay coefficient can be used during handover from the first position detection system to the second position detection system, for example, as the substrate table WT moves out from under the projection system PS. Additionally or alternatively in an embodiment the time delay coefficient is used to ensure that measurements made by the first and second position detection systems for the calculating of the difference are made at the same time.

In order to calibrate the delay coefficient the substrate table WT is moved to or from a position at which it is stationary. It is then possible to determine from the change in position with time detected by the first and second position detection systems the difference in time delay from measurement to output of position between the first and second position detection systems. The measured difference in time delay can be used to update the time delay coefficient.

As will be clear from the description of initial calibration below, the coefficients of the calibration data include a first set which relate the position of the target relative to a reference point, for example on the object, or a reference point in fixed relation relative to the projection system PS. The coefficients include a second set which relate to the relative positions of the plurality of sensors to one another.

The following embodiments explain how the initial calibration can be performed and the meaning of the calibration coefficients.

First the interferometer system of the second position detection system IF is calibrated. The calibration is to account for any deviation from orthogonal of the X and Y mirrors 140, 130. The substrate table WT can be moved in the Y direction only which, if the X mirror 140 is not perpendicular to the y direction results in a shift in the detected X position. This can be used to generate calibration data indicative of the detected shift which is related to the degree of non-orthogonality of the X and Y mirrors 140, 130. Movement in the y direction can be used to make a similar calibration of the Y mirror 130.

Two emitter/receiver combinations 120 are provided on the Y axis so that rotation about the Z axis can be measured. That is, the rotation is equal to the difference between the readings of the two Y emitter/receiver combinations 120 divided by the distance separating those two emitter/receiver combinations 120 in the Y direction. This method of calibration also accounts for any deviation from being perfectly flat of the X and Y mirrors 140, 130.

The calibration data for the X and Y mirrors 140, 130 (e.g. non-uniform gaps in the gratings) can be collated in any way including using fish bone structures, stitched exposures and substrate rotation.

Figure 7:
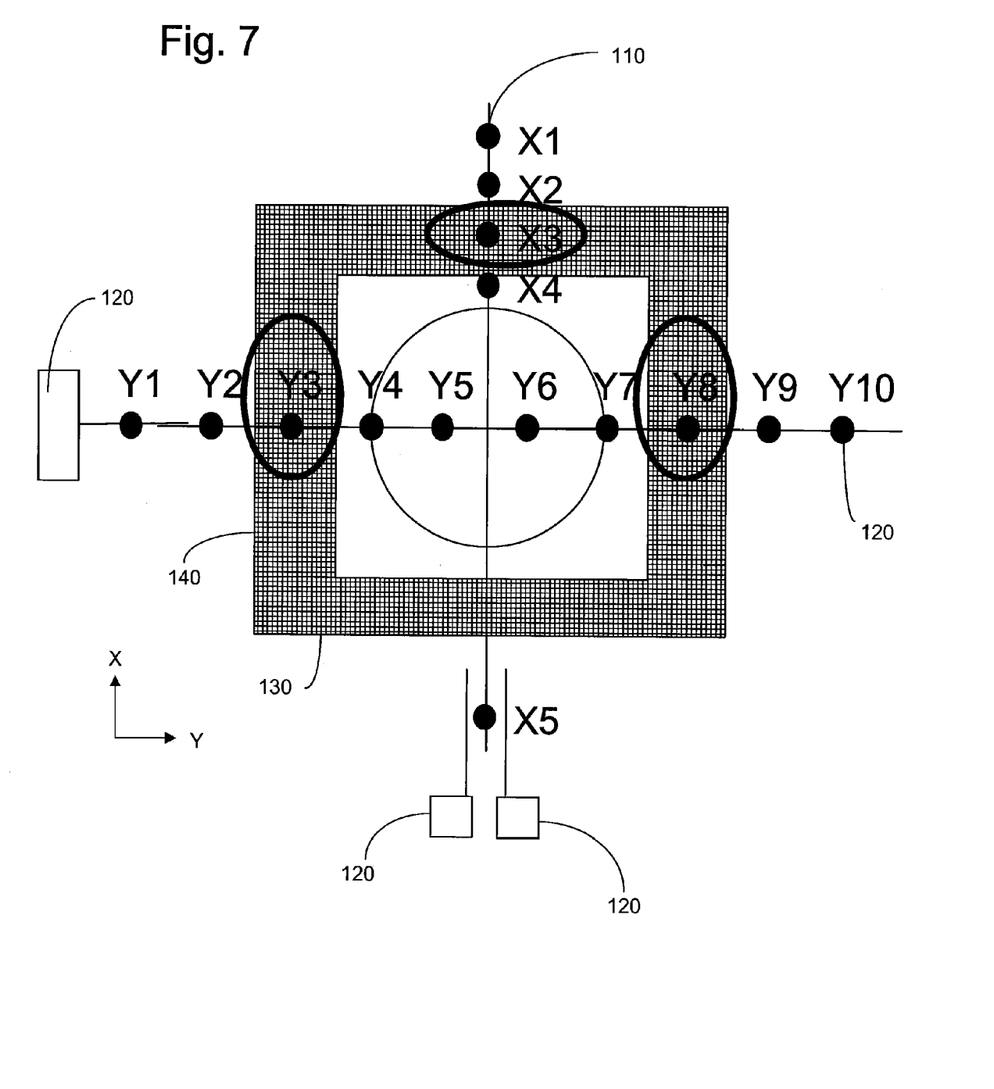
FIG. 7 illustrates, in plan, a common co-ordinate system of first and second position detection systems.

FIG. 7 illustrates how a common co-ordinate is generated for the first and second position detection systems. As can be seen, the axes of the emitter/receiver combinations 120 of the second position measurement system IF are aligned with the axes of the encoders 110 of the first position detection system. At the same time with the encoders 110 (X1-X5 and Y1-Y10) of the first position detection system are used for detecting the position of the substrate table WT when at the origin are defined. As can be seen from FIG. 7 these are the X3, Y3 and Y8 encoders. In FIG. 7 the area of use of those sensors has also been indicated with ovals.

Figure 8:
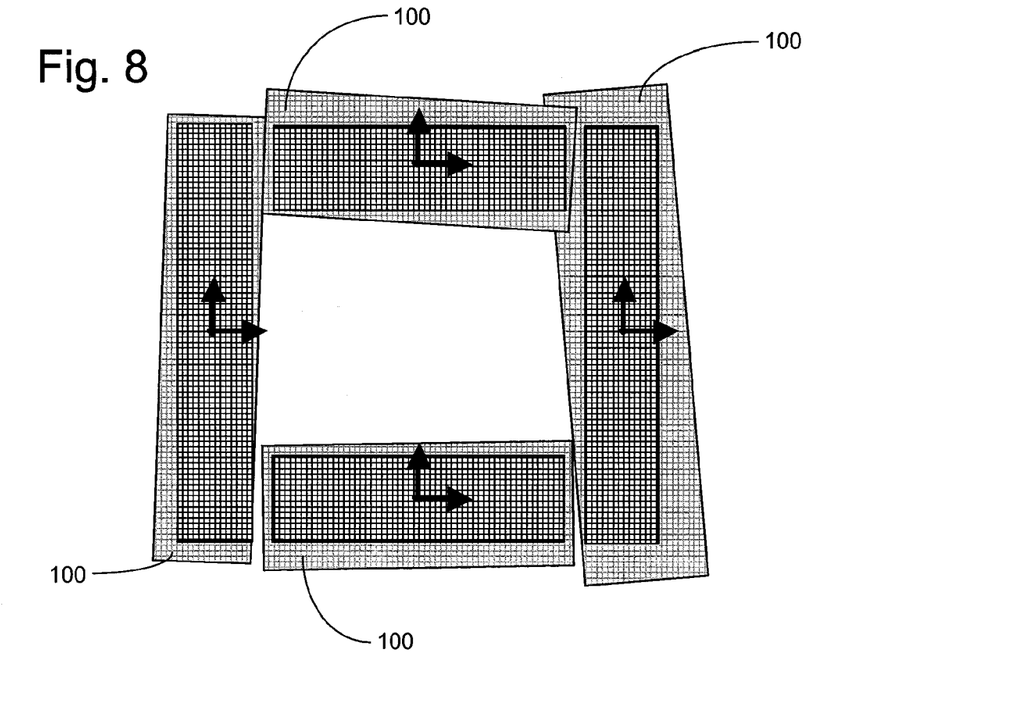
FIG. 8 illustrates, in plan, possible misalignments of the target to the common co-ordinate system of FIG. 7.

In FIG. 8 it can be seen that the targets 100 mounted to the object may not be orthogonal to one another and may not be orthogonal to the defined co-ordinate system of FIG. 7. Therefore, for each encoder 110 (X1-X5 and Y1-Y10) an area is defined on the respective target 100 which can be used by that encoder 110 (similar to the ovals shown in FIG. 7). In this way a relationship such as that illustrated schematically in FIG. 8 can be assembled. That is, along the Y axis it can be seen which two of the encoders Y1-Y10 can be used for any particular position of the substrate table WT. In transition areas, for example moving between Y1 & Y6 to Y2 & Y7, the influence on the position reading changes from 100% Y1 & Y6 and 0% Y2 & Y7 to 100% Y2 & Y7 and 0% Y1 & Y6. Any function can be used to transfer between the combinations including linear but a smoother waiting function, for example a gaussian weighting function is preferred.

Figure 10:
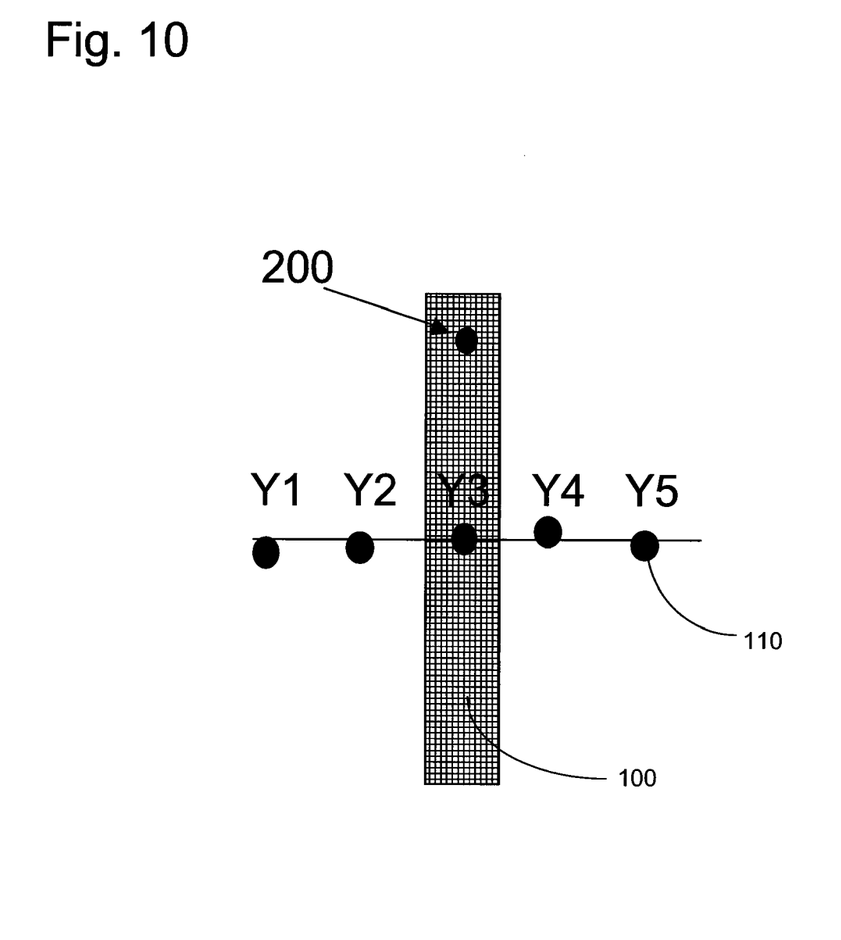
FIG. 10 illustrates calibration of relative positions of encoders.

After the above rules have been defined, it is possible to calibrate X and Y encoder 110 offsets. That is, a set of calibration data is generated which defines the position of the encoders 110 relative to each other. How this is done for the Y encoders (Y1-Y10) is illustrated in FIG. 10. The same system can be used for the X encoders (X1-X5). A reference mark 200 is provided somewhere on the substrate table WT. In the illustrated embodiment the reference mark 200 is provided on the target 100. The reference mark 200 can be seen by an encoder. A first encoder, for example, Y3 as illustrated, is defined as being on the axis defined in FIG. 7. The substrate table WT is then moved under control of the second position measurement system IF (the interferometer version) in the X direction and the off-set of each of the encoders Y1, Y2, Y4, Y5 from the axis which runs through the centre of encoder Y3 is determined. The second position detection system IF is used to determine the distance between the encoders 110 in the Y direction. Therefore, this calibration data allows corrections to be made to measured values of the first position detection system to account for physical imperfections in the relative positioning of the encoders 110.

Figure 9:
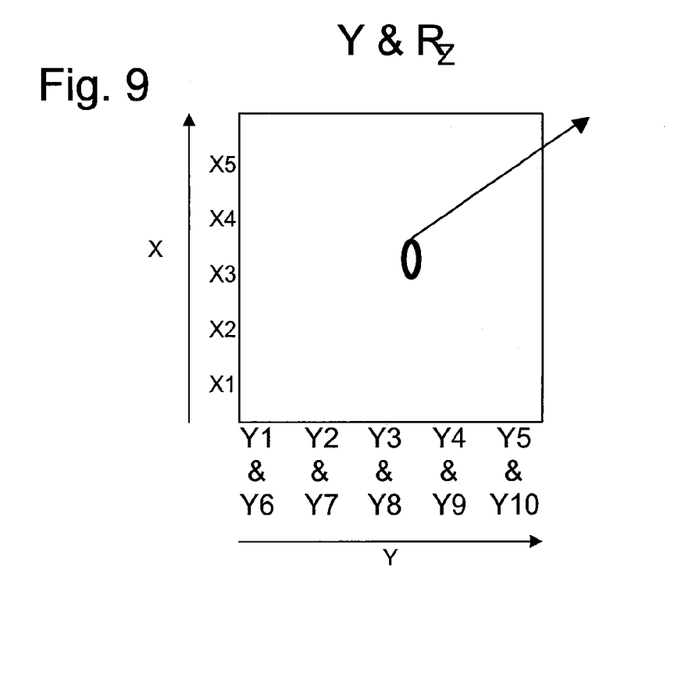
FIG. 9 illustrates which encoder combinations are used to measure the position of the substrate table at any given actual position.
Figure 11:
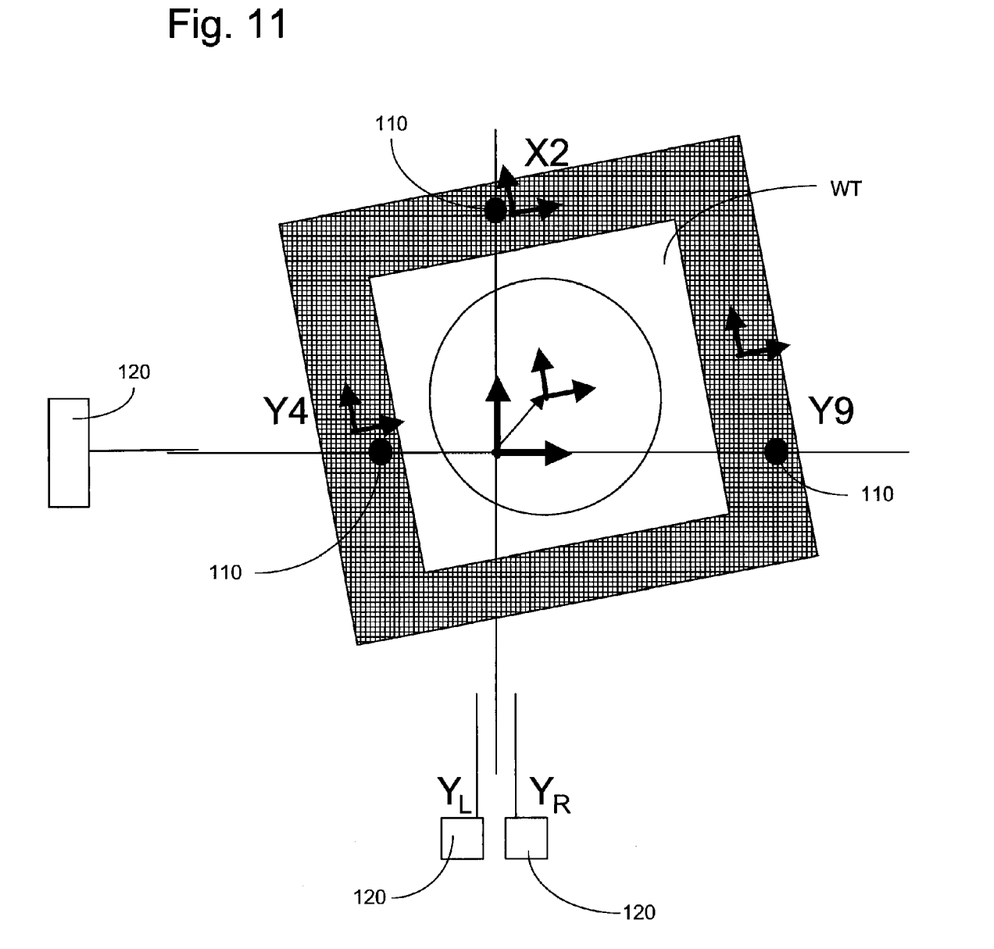
FIG. 11 illustrates calibration of the target relative to the co-ordinate system.

FIG. 11 shows how a second set of calibration data is generated which relates for any X and/or Y shift of the target 100 relative to the origin of the shared co-ordinate system defined in FIG. 7 of the substrate table WT. That is, for each position of the substrate table WT the second position detection system IF using interferometers can determine the X, Y and Rz position. For each position the encoder 110 (Y1-Y10, X1-X5) combinations and weightings are known (from FIG. 9). The off-sets of the encoders 110 relative to each other are known from the calibration carried out with reference to FIG. 10. Therefore, in the FIG. 11 step the actual target 100 location defined in terms of the common co-ordinates can be calculated because the relative position of the encoders 110 to the emitter/receiver combinations 120 are known. The position of the target 100 may be calibrated using just one encoder 110 and this information can be used later by all encoders 110, in use. That is, one encoder 110 is used to define the second set of calibration data which defines the X, Y positional spacing between grid points on the grid of the target 100. This is performed several times for each position and the results are averaged to remove noise.

In this way the target 100 can be calibrated based on an ideal second position determining system IF. In one embodiment the calibration data is smoothed to ensure no sudden jumps in measured position, in use.

The first position detection system makes measurements using the encoders 110. These measurements are used to calculate an apparent measured position. The calibration data is then used to transform the apparent measured position into the actual position. The actual position measured by the first position detection system corresponds to the position determined by the second position detection system IF (using the calibration data as described above with reference to FIG. 6).

Figure 12:
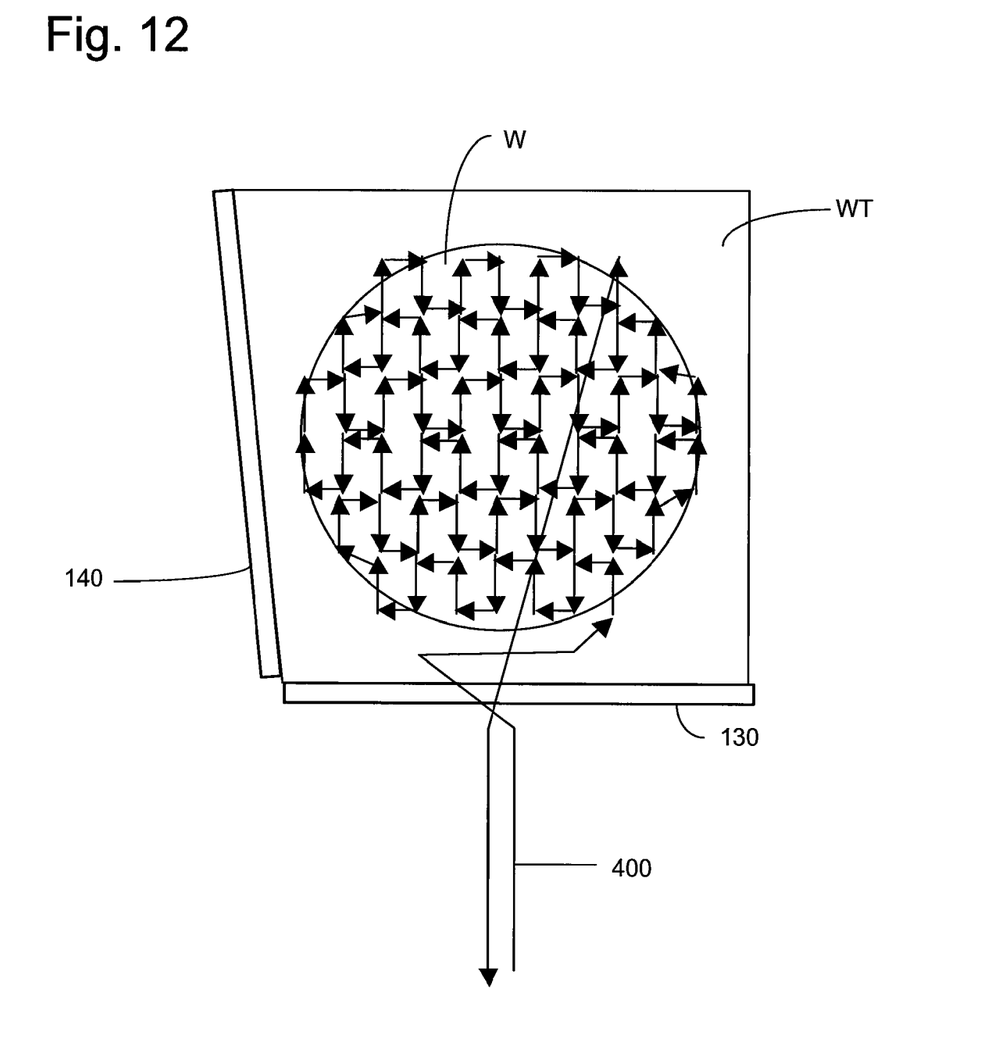
FIG. 12 illustrates schematically, in plan, a typical movement of a substrate under a projection system.

During normal operation the substrate table WT will traverse a path 400 such as that illustrated in FIG. 12 thereby to expose all fields of the substrate W to radiation through the projection system PS. During such an operation both the first and second position detection systems can be used to measure the position of the substrate table WT and the results can be compared as described above for the method of updating calibration data.

The object mentioned above may be, for example, a substrate, a substrate table, a mask or a mask support structure.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A method of updating calibration data of a first position detection system adapted to determine the position of an object, the first position detection system comprising a target and a sensor, the target or the sensor being mounted on the object, and the calibration data comprising a coefficient relating an apparent measured position of the object to an actual position of the object, the coefficient being used to convert the apparent measured position to the actual position to correct an error in the first position detection system and to enable determination of the actual position of the object from the apparent measured position of the object, the method comprising:
    determining the position of the object using a second position detection system that is independent of the first position detection system;
    calculating a difference between the position detected by the second position detection system and a position of the object determined by the first position detection system; and
    updating the coefficient of the respective apparent measured position of the object by the first position detection system using the calculated difference on the assumption that the position determined by the second position detection system is the actual position of the object,
    wherein measurements made to determine the positions of the object used to calculate the difference are made during periods of normal use of the object.

2. The method of claim 1, wherein the first and second position detection systems determine the position of the object simultaneously.

3. The method of claim 1, wherein a fraction of the calculated difference is applied to the coefficient when updating the coefficient.

4. The method of claim 3, wherein the calculated difference is filtered with a low pass filter before being used to update the coefficient.

5. The method of claim 4, wherein in the low pass filter the calculated difference is used to calculate a desired change in coefficient to convert the apparent measured position of the first position detection system into the position detected by the second position detection system.

6. The method of claim 1, wherein the updating only occurs after the calculated difference for a given measured position has been calculated to be within a predetermined range for more than a predetermined number of times for a given apparent measured position.

7. The method of claim 1, wherein the updating includes updating coefficients for measured positions adjacent the respective apparent measured position, to smooth out the difference in coefficients between adjacent apparent measured positions.

8. The method of claim 1, wherein the calculated difference is only used to update the coefficient when the calculated difference is calculated for positions based on measurements made during periods of zero acceleration of the object.

9. The method of claim 1, wherein the calibration data includes an indicator of the last time the difference for each apparent measured position was calculated.

10. The method of claim 9, further comprising moving the object to an apparent measured position for which the calibration data indicates the difference as not having been calculated for at least a predetermined time and calculating the difference.

11. The method of claim 1, wherein the calibration data includes a time delay coefficient indicative of the difference in time delay between the calculation of the actual position and/or apparent measured position of the object by the first position detection system and the calculation of the position of the object by the second position determination system.

12. The method of claim 11, wherein the time delay coefficient is used to ensure that measurements made by the first and second position detection systems for the calculating of the difference are made at the same time.

13. The method of claim 1, wherein the coefficients include a first set which relate to the position of the target relative to a reference point.

14. The method of claim 1, wherein the coefficients include a second set which relate to the relative positions of a plurality of sensors to one another.

15. The method of claim 1, wherein the second position detection system is adapted for detecting the position of the object throughout the travel range of the object.

16. The method of claim 1, wherein the first position detection system is for the determination of the position of the object for only a localized area of the travel range of the object.

17. The method of claim 1, wherein a beam path of a measurement beam of the first position detection system is on average shorter than the beam path of a detection beam of the second position detection system.

18. The method of claim 1, wherein the object is an object of a lithographic apparatus.

19. A controller for updating calibration data of a first position detection system, the controller comprising one or more processors for executing machine readable instructions stored on a data storage medium to perform the method of claim 1.

20. A device manufacturing method comprising directing a patterned beam of radiation through a projection system onto a substrate which is positioned on an object and moving the substrate relative to the projection system during directing and/or between discrete directing steps on the same substrate, the method of claim 1 being performed simultaneously to movement of the substrate.

* * * * *